United States Patent
Chen et al.

(10) Patent No.: US 6,576,985 B2
(45) Date of Patent: Jun. 10, 2003

(54) SEMICONDUCTOR DEVICE PACKAGING ASSEMBLY

(75) Inventors: Max Chen, Taipie Hsien (TW); Ching Lu Hsu, Taipei Hsien (JP); Kuang Hann Lin, Taipei (TW); Yan-Man Tsui, Union City, CA (US)

(73) Assignee: General Semiconductor Taiwan, Ltd., Taipei (TW)

( * ) Notice: Subject to any disclaimer, the term of this patent is extended or adjusted under 35 U.S.C. 154(b) by 0 days.

(21) Appl. No.: 09/764,955

(22) Filed: Jan. 18, 2001

(65) Prior Publication Data

US 2002/0000647 A1 Jan. 3, 2002

(30) Foreign Application Priority Data

May 30, 2000 (TW) ........................................ 89110527 A

(51) Int. Cl.⁷ ............................................. H01L 23/495
(52) U.S. Cl. ........................ 257/676; 257/666; 257/670
(58) Field of Search ................................ 257/666, 670, 257/672, 673, 676

(56) References Cited

U.S. PATENT DOCUMENTS

| | | | | |
|---|---|---|---|---|
| 5,493,151 A | * | 2/1996 | Asada et al. ................ | 257/686 |
| 5,719,435 A | * | 2/1998 | Davis et al. ................ | 257/666 |
| 5,920,117 A | * | 7/1999 | Sono et al. .................. | 257/675 |
| 6,002,165 A | * | 12/1999 | Kinsman ...................... | 257/666 |
| 6,100,598 A | * | 8/2000 | Kanesaka .................... | 257/787 |
| 6,258,624 B1 | * | 7/2001 | Corisis ........................ | 438/106 |
| 6,326,243 B1 | * | 12/2001 | Suzuya et al. .............. | 438/124 |
| 2002/0110955 A1 | * | 8/2002 | Patrice et al. ............... | 438/106 |
| 2002/0180008 A1 | * | 12/2002 | Corisis ........................ | 257/666 |

* cited by examiner

Primary Examiner—Tom Thomas
Assistant Examiner—Douglas W. Owens
(74) Attorney, Agent, or Firm—Mayer Fortkort & Williams, PC; Karin L. Williams, Esq.

(57) ABSTRACT

The present invention provides a semiconductor device packaging assembly and method for manufacturing the assembly. Preferably, the method of the present invention is used to assemble a plurality of semiconductor chips, such that the throughput of assembly can be enhanced, by providing a bottom frame matrix including a plurality of bottom frame units, each of which unit includes a bottom supporting portion and a bottom frame portion; providing a bridge frame including a plurality of bridge frame units, each of which unit includes a bridge frame portion and a plurality of conducting bars; placing each of the semiconductor chips on each of the bottom supporting portions, respectively; and bonding each bottom frame unit and each bridge frame unit together, wherein, the conducting bars extending from each bridge frame portion toward corresponding chips are electrically coupled to bonding areas of the corresponding chips.

7 Claims, 4 Drawing Sheets

SEMICONDUCTOR DEVICE PACKAGING ASSEMBLY

FIELD OF INVENTION

The present invention relates to a semiconductor device packaging assembly and method of manufacturing the same, and more particularly, relates to a method for assembling a plurality of semiconductor chips at a time, and the semiconductor chip assemblies formed by the method. By using the method provided in the present invention, the throughput of assembling semiconductor devices can be significantly enhanced.

BACKGROUND OF INVENTION

The "assembly" of a semiconductor device package mentioned in the present invention particularly refers to the procedure of electrically coupling bonding areas, such as bonding pads, of the main surface of a chip to the leadframe, during the process of semiconductor device packaging after the manufacturing of the semiconductor chip.

A conventional assembly of a semiconductor device, please refer to FIG. 1A showing the common packaging assembly of a single semiconductor chip, employs the wire bonding method. A plurality of metal wires 11 are bonded between the bonding areas 101 of the chip 100 and the leadframe 102, for providing the electrical conduction therein. Since the exemplary packaging assembly illustrated in FIG. 1A is directed to that of a single semiconductor transistor (in fact, it is the packaging assembly of a power MOSFET), some pins (e.g., PINs 1–3) are connected together and electrically coupled to an electrode (i.e., the drain electrode) of the chip via wires 11. As for PIN 4, this pin is connected to another electrode (i.e., the gate electrode) of the chip via a wire.

There are many drawbacks in the conventional semiconductor device packaging assembly as shown in FIG. 1A, especially in the aspect of manufacturing efficiency. To improve the manufacturing throughput in mass production, conventional technologies adopt the following approaches. Referring to FIG. 1B, a plurality of semiconductor chips are assembled by using a single row of leadframe strip 12. The leadframe strip 12 comprises many repeated units of leadframes 102. The fine architecture of the leadframe 102 is not shown in FIG. 1B; however, it can be referred to the leadframe 102 in FIG. 1A. Many chips 100 to be assembled are respectively placed on the leadframes 102 and then, the above-mentioned wire bonding method is applied to those chips to electrically connect each of the bonding pads 101 to the corresponding leadframe via wires 11. Generally speaking, the method shown in FIG. 1B is the one-dimensional extension of the single chip packaging assembly shown in FIG. 1A, so that the assembly can be easily adapted to the processing on a production line. In addition, the single row of leadframe strip 12 uses equally spaced sprocket holes 103 consecutively appearing on two edges of the strip 12, to enhance the alignment or reeling of the leadframe strip 12. The production efficiency is therefore improved.

To further improve the production efficiency, referring to FIG. 1C, the conventional technique extends the one-dimensional, single row leadframe strip of FIG. 1B to a two-dimensional, planar leadframe matrix for use in the assembly of many semiconductor chips. However, as shown in FIG. 1C, conventional technique still utilizes the wire bonding method to bond wires 11 between each chip 100 and the corresponding leadframe 102.

Although the above techniques of the semiconductor device packaging assembly, somehow, are gradually improved in the aspect of production efficiency, the effects of improvement on throughput are actually quite limited and there are still many disadvantages left to be overcome in the prior art. The major reason for the disadvantages is due to the constraint set by the wire bonding method. Specifically, as clearly shown in FIGS. 1A, 1B and 1C, all assembly methods involve the step of bonding a plurality of wires 11 between the leadframes 102 and the bonding areas 101 of the chips. As a result, despite the methods of the single row leadframe strip and planar leadframe matrix, which deal with the semiconductor device packaging assembly in a "multi-tasking" manner, the improvement of production throughput is not significant. Besides, conventional techniques unquestionably will engage all the drawbacks of the wire bonding method, such as bad utilization rate of the whole chip area, poor thermal dissipation of the package, complicated manufacturing processes, low production efficiency and unstability of the package.

There is, thus, a need to provide a highly efficient semiconductor device packaging assembly and method for manufacturing the same, which can assemble a plurality of semiconductor chips at the same time. Such assembly and method can significantly increase the production throughput and also solve the problems caused by the wire bonding method. This invention addresses the need.

SUMMARY OF INVENTION

An object of the present invention is to provide a semiconductor device packaging assembly and method of manufacturing the same, which have simplified manufacturing processes and also can significantly increase the production throughput.

Another object of the present invention is to provide a semiconductor device packaging assembly and method of manufacturing the same, which can efficiently utilize the chip area, and dissipate the heat effectively. The manufacturing processes of the assembly are easy and the stability of the assembly is good.

According to a semiconductor device packaging assembly method of the present invention, which can be used for assembling a plurality of semiconductor chips at a time, the method can enhance the production throughput of the assembly. Said method comprises the steps of: providing a row of a bottom frame strip having a plurality of bottom frame units, each bottom frame unit including a bottom supporting portion and a bottom frame portion; providing a row of a bridge frame strip having a plurality of bridge frame units, each bridge frame unit including a bridge frame portion and a plurality of conducting bars; placing each of the chips on each of the bottom supporting portions, respectively, and attaching the opposite surface of the main surface of each chip to the respective bottom supporting portion; and bonding each bottom frame unit and each bridge frame unit together, wherein, each of the conducting bars extending from each bridge frame portion toward the chip is electrically coupled to the corresponding bonding area of the chip.

According to another semiconductor device packaging assembly method of the present invention, which can be used for assembling a plurality of semiconductor chips at a time, the method can enhance the production throughput of the assembly. Said method comprises the steps of: providing a bottom frame matrix having a plurality of bottom frame units, each bottom frame unit including: a bottom supporting portion and a bottom frame portion; providing a bridge frame matrix having a plurality of bridge frame units, each bridge frame unit including: a bridge frame portion and a plurality of conducting bars; placing each of the chips on each of the bottom supporting portions, respectively, and attaching the opposite surface of the main surface of each chip to the respective bottom supporting portion; and bonding each bottom frame unit and each bridge frame unit together, wherein, each of the conducting bars extending from each bridge frame portion toward the chip is electrically coupled to the corresponding bonding area of the chip.

Because the above semiconductor device packaging assembly methods employ bridge frame units having conducting bars for providing the electrical connection between the leadframes and the chips, rather than employing the wire bonding approach, the manufacturing processes in the present invention are no longer complicated and time-consuming. While assembling a plurality of semiconductor chips at a time, the present invention can significantly increase the throughput of assembly and achieve a much better effect than the conventional wire bonding technique.

Furthermore, because the present invention does not use wire bonding, the utilization of the chip area is maximized, and the stability of the packaging is enhanced. Meanwhile, due to the larger bonding areas by using conducting bars rather than bonding wires, the present invention accomplishes a packaging assembly having better thermal properties.

BRIEF DESCRIPTION OF DRAWINGS

The present invention now will become better understood with regard to the accompanying drawings in which.

DETAILED DESCRIPTION OF INVENTION

A preferred embodiment of the present invention will be described below with reference to the accompanying drawings.

FIGS. 2A–2D illustrate a semiconductor device packaging assembly in accordance with the preferred embodiment of the present invention, which is in a two-dimensional, planar frame matrix manner. As for the embodiments of a single leadframe or one-dimensional frame strip, they can be easily realized based on the recognition of the given two-dimensional embodiment.

Figure 2A:
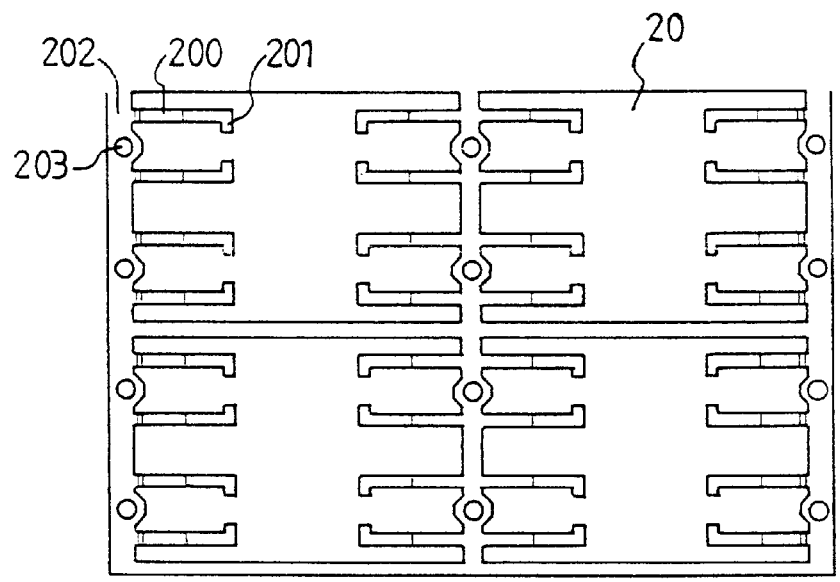
FIG. 2A is a top plan view of a planar bridge frame matrix used in the semiconductor device assembly according to a preferred embodiment of the present invention.
Figure 2B:
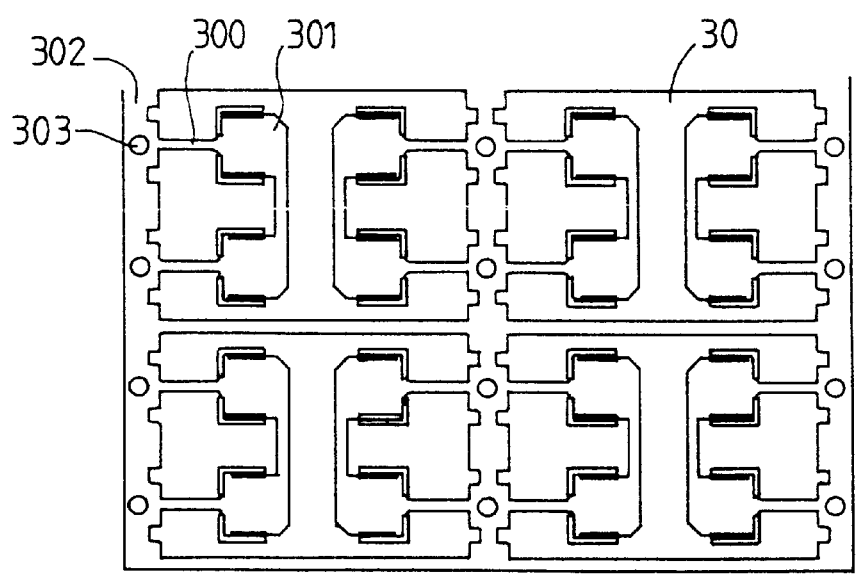
FIG. 2B is a top plan view of a planar bottom frame matrix used in the semiconductor device assembly according to a preferred embodiment of the present invention.

First, referring to FIG. 2A, it shows an important structural feature of the present invention different from that of the prior art, that is, the planar bridge frame matrix is used for assembling a plurality of semiconductor chips. The bridge frame matrix includes a plurality of bridge frame units 20 (in particular, there are four units shown in FIG. 2A). Certainly, the exact number of bridge frame units 20 comprised in a planar bridge frame matrix can be adjusted in accordance with the actual need of assembly line. It is free to design the bridge frame matrix with repeated bridge frame units having the same pattern, or with different bridge frame units having different patterns. Each bridge frame unit 20 comprises a bridge frame portion 202 and a plurality of conducting bars 200. The bridge frame portion 202 serves not only as the structural support of the bridge frame matrix, but also as the attaching part for bonding to the planar bottom frame matrix as shown in FIG. 2B (described below). Each bridge frame unit also comprises a plurality of conducting bars 200, which extend from the bridge frame portion 202 to the corresponding chip (approximately in the direction toward the center of each bridge frame unit), and are used for electrically coupling to the bonding areas 101 of the main surface of each chip. In a more preferred embodiment, each conducting bar 200 further, comprises a bonding portion 201 for direct coupling to the corresponding bonding area of the chip. The bonding between conducting bars 200 and chips is mainly by soldering or by attaching with conductive glue, etc.

In other words, the bridge frame matrix is used to replace the bonding wires in the prior art. The composition materials and producing process of the bridge frame matrix are similar to those of common leadframes. For example, preferably, the bridge frame matrix is made of copper and its pattern can be formed by methods such as punching or etching.

FIG. 2B shows a planar bottom frame matrix used in the semiconductor device assembly according to a preferred embodiment of the present invention. The reason for using the expression "bottom frame matrix" is that the leadframe shown in FIG. 2B is placed under a semiconductor chip while performing the chip assembly. The surface of the semiconductor chip containing areas of electronic elements and bonding pads is called the main surface. The opposite surface of the main surface is the bottom surface of the chip, and the bottom frame matrix 30 is attached to the bottom surface for supporting or fixing the chip. Thus, the bottom frame matrix also partially plays the role of a leadframe. The composition materials and producing process of the bottom frame matrix are similar to those of common leadframes. For example, preferably, the bottom frame matrix is made of copper and its pattern can be formed by methods such as punching or etching.

Referring to FIG. 2B, the bottom frame matrix includes a plurality of bottom frame units 30 (in particular, there are four units shown in FIG. 2B). Certainly, the exact number of bottom frame units 30 comprised in a planar bottom frame matrix can be adjusted in accordance with the actual need of assembly line. It is free to design the bottom frame matrix with repeated bottom frame units having the same pattern, or with different bottom frame units having different patterns. Each bottom frame unit 30 comprises a bottom supporting portion 301 and a bottom frame portion 302. According to a semiconductor device packaging assembly method, a plurality of chips are respectively placed upon the bottom supporting portions 301 of the bottom frame units, and the bottom surfaces (the opposite surface of the main surface) of the chips are attached to the bottom supporting portions 301. The method of the attachment is similar to bonding a chip to a leadframe.

After fixing the chips to the bottom frame units 30, the next step is to bond the planar bridge frame matrix in FIG. 2A together with the planar bottom frame matrix in FIG. 2B, in order to form a chip packaging assembly of, respectively, a bridge frame unit 20, a chip 100 and a bottom frame unit 30. The conducting bars 200 extending from the bridge frame portion 202 toward the chip are in electrical connection with the bonding areas on the main surface of the chip. As mentioned above, in a more preferred embodiment shown in FIG. 2A, each conducting bar 200 further comprises a bonding portion 201 for direct coupling to the corresponding bonding area of the chip. The bonding between conducting bars 200 and chips is mainly by soldering or by attaching with conductive glue, etc.

A preferred method for bonding the planar bridge frame matrix in FIG. 2A and the bottom frame matrix in FIG. 2B is to use both the bottom frame portion 302 of each bottom frame unit 30 and the bridge frame portion 202 of each bridge frame unit 20. In another preferred embodiment of the present invention, a plurality of sprocket holes (303, 203) formed on each bottom frame portion 302 and bridge frame portion 202, respectively, are used to bond the bottom frame matrix together with the bridge frame matrix. The sprocket holes (303, 203) can help to align or reel both the bottom frame unit 30 and bridge frame unit 20, and considerably increase the throughput of mass production, as well as the precision of manufacturing processes.

Figure 2C:
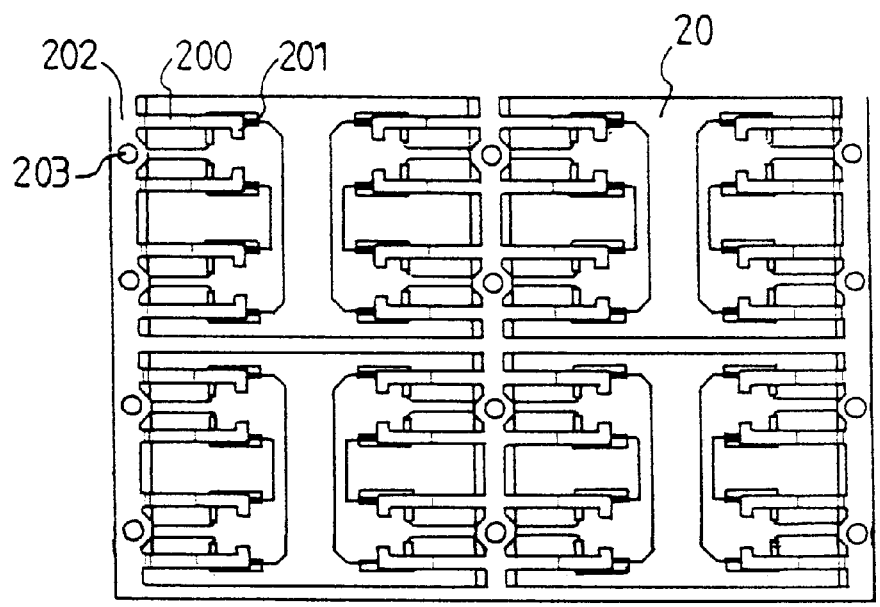
FIG. 2C is a top plan view of bonding a planar bridge frame matrix together with a planar bottom frame matrix according to a preferred embodiment of the present invention.
Figure 2D:
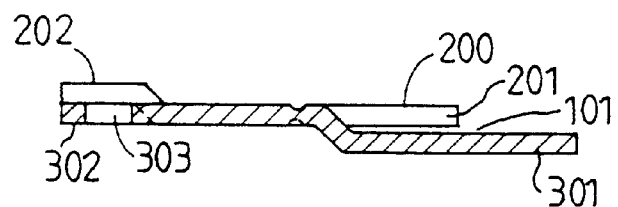
FIG. 2D is a side view of bonding a planar bridge frame matrix together with a planar bottom frame matrix according to a preferred embodiment of the present invention

FIGS. 2C and 2D are a top plan view and a side view, respectively, of bonding a planar bridge frame matrix together with a planar bottom frame matrix according to a preferred embodiment of the present invention. It is shown in FIG. 2C that a plurality of sprocket holes (303, 203) are used to align the bottom frame portion 302 and the bridge frame portion 202, so as to bond each bottom frame unit 30 with corresponding bridge frame unit 20. The bonded structure, as clearly shown in the side view FIG. 2D, illustrates a stack formed by the bridge frame unit 20, the bonding area 101 of the chip and the bottom frame unit 30, in the vertical order. The bending portions of both the bridge frame unit 20 and bottom frame unit 30 are also shown in FIG. 2D. Moreover, FIG. 2D illustrates the bonding configuration of the bottom frame portion 302 and bridge frame portion 202. FIG. 2D also illustrates the relative positions among the bonding portion 201 at the frond end of the conducting bar 200, the bonding area 101 of the chip and the bottom supporting portion 301.

From the foregoing, it will be apparent that the present invention mainly relates to the assembly process of electrically coupling the bonding areas of the main surface of the chips to the leadframes. The subsequent packaging processes after completing the assembly process will not be described here, since they are not the inventive features of the present invention. However, persons skilled in the art certainly can easily accomplish a semiconductor chip packaging after reading of the above-mentioned technical contents of the present invention.

Figure 1A:
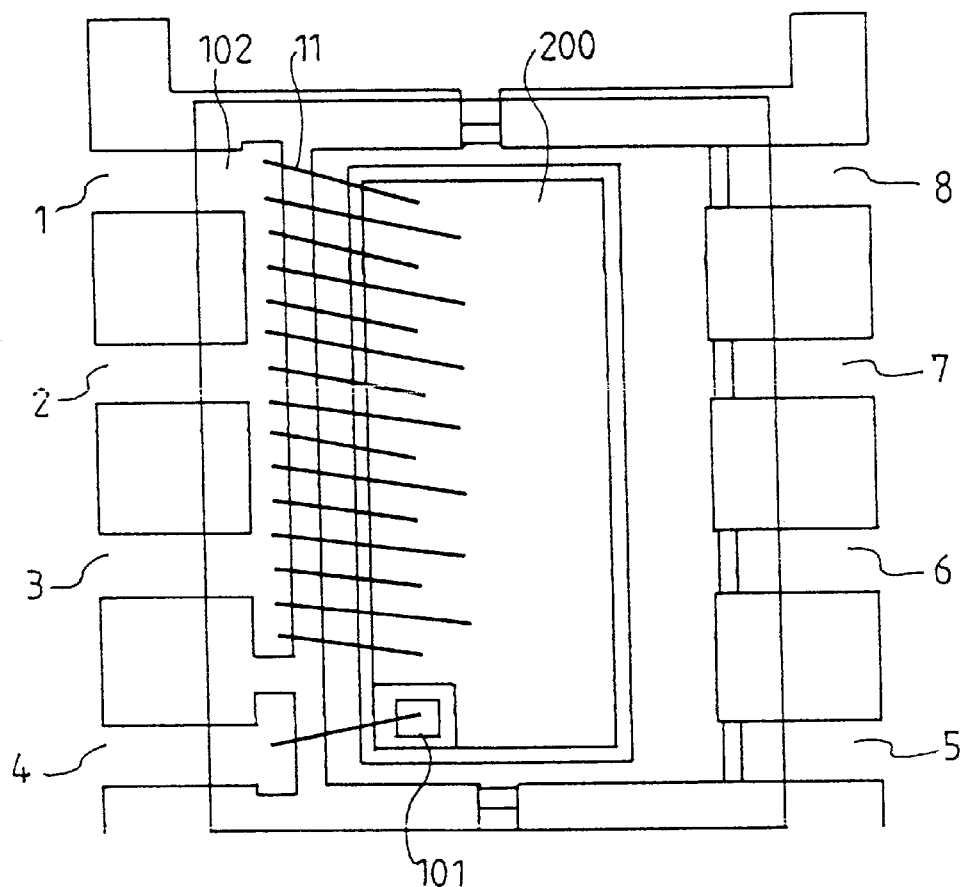
FIG. 1A is a top plan view of a conventional packaging assembly of a single semiconductor chip.
Figure 1B:
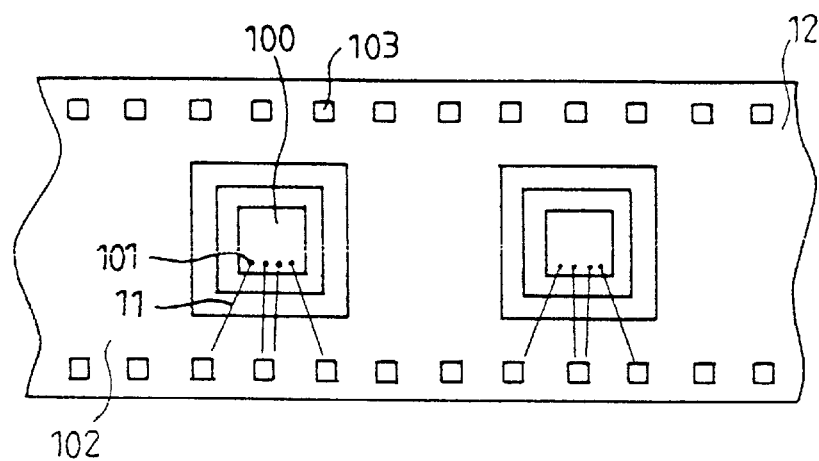
FIG. 1B is a top plan view of a conventional packaging assembly of many semiconductor chips using a single row of leadframe strip.
Figure 1C:
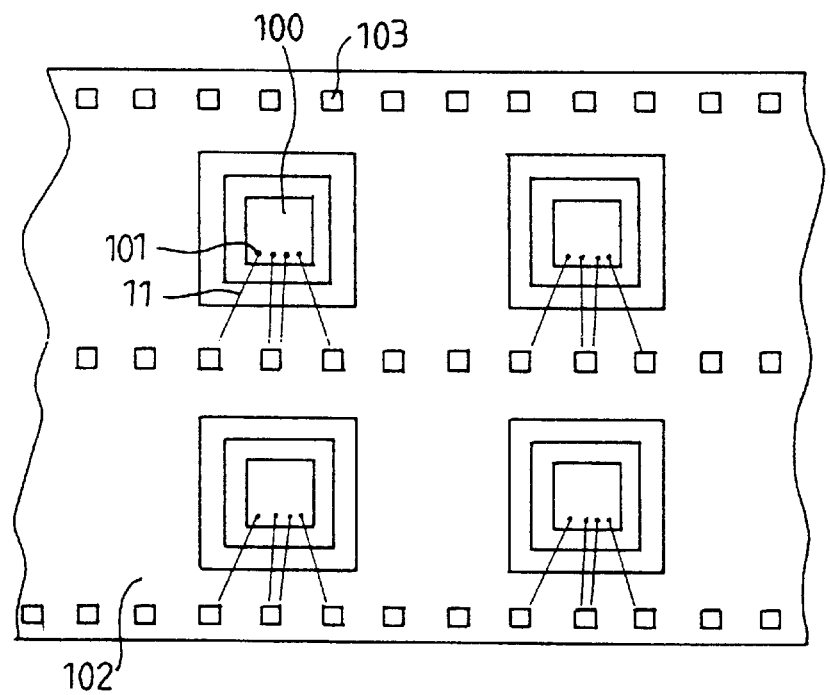
FIG. 1C is a top plan view of a conventional packaging assembly of many semiconductor chips using a planar leadframe matrix.

Because the present invention does not employ the wire bonding approach for providing electrical connection between the bonding pads and leadframe, a plurality of semiconductor chips can be assembled at a time. The assembly process is simplified, and the production efficiency is so high that the assembly throughput of the present invention can be promoted to be much higher than that of conventional wire bonding (about 6 to 10 times higher than the throughput of the prior art in FIG. 1).

In addition, the present invention can make good use of the chip area and enhance the stability of the packaging. Meanwhile, due to the larger bonding areas by using conducting bars rather than bonding wires, the packaging assembly disclosed in the present invention dissipates the heat much more easily than the prior art did.

From the invention thus described, it will be obvious that the embodiments and description are not indeed to limit the invention. The invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor device packaging assembly, comprising:
    a semiconductor chip (100) having a main surface, the main surface including at least an element area and at least a bonding area (101);
    at least one bottom frame unit (30) including; a bottom supporting portion (301) for attaching to the opposite surface of the main surface of the chip and supporting the chip, and a bottom frame portion (302); and
    at least one bridge frame unit (20) including: a bridge frame portion (202) for bonding together with the bottom frame portion (302) of the bottom frame units (30), and a plurality of conducting bars (200) extending from the bridge frame portion towards the chip;
    wherein each of the conducting bars directly contacts the corresponding bonding area of the chip so as to be electrically connected thereto.

2. The semiconductor device packaging assembly of claim 1, wherein each of the at least one bottom frame unit is joined one after another to form at least one row of a bottom frame strip, and each of the at least one bridge frame unit is joined one after another to form at least one row of a bridge frame strip.

3. The semiconductor device packaging assembly of claim 2, wherein each of the bottom frame strip is joined one after another to form a bottom frame matrix, and each of the bridge frame strip is joined one after another to form a bridge frame matrix.

4. The semiconductor device packaging assembly of claim 1, wherein both the frame bottom portion and bridge frame portion comprise a plurality of sprocket holes for aligning the bottom frame unit and bridge frame unit.

5. The semiconductor device packaging assembly of claim 1, wherein the bottom frame unit and bridge frame unit are formed of copper.

6. The semiconductor device packaging assembly of claim 1, wherein each of the conducting bars further comprises a bonding portion for electrically coupling to the corresponding bonding area of the chip.

7. The semiconductor device packaging assembly of claim 1, wherein the bottom supporting portion is joined with the bottom frame portion via at least one supporting bar.

* * * * *

UNITED STATES PATENT AND TRADEMARK OFFICE
CERTIFICATE OF CORRECTION

PATENT NO. : 6,576,985 B2 Page 1 of 1
APPLICATION NO. : 09/764955
DATED : June 10, 2003
INVENTOR(S) : Max Chen et al.

It is certified that error appears in the above-identified patent and that said Letters Patent is hereby corrected as shown below:

Col. 6, line 24, Claim 1, after "(30)", change "including;" to --including:--.

Signed and Sealed this

Twenty-ninth Day of May, 2007

JON W. DUDAS
*Director of the United States Patent and Trademark Office*